United States Patent
Murakami et al.

(10) Patent No.: US 7,550,371 B2
(45) Date of Patent: Jun. 23, 2009

(54) METHOD OF PRODUCING SIMOX WAFER

(75) Inventors: Yoshio Murakami, Tokyo (JP);
Riyuusuke Kasamatsu, Tokyo (JP);
Yoshiro Aoki, Tokyo (JP)

(73) Assignee: SUMCO Corporation, Tokyo (JP)

( * ) Notice: Subject to any disclaimer, the term of this patent is extended or adjusted under 35 U.S.C. 154(b) by 128 days.

(21) Appl. No.: 11/729,292

(22) Filed: Mar. 27, 2007

(65) Prior Publication Data
US 2007/0224774 A1    Sep. 27, 2007

(30) Foreign Application Priority Data
Mar. 27, 2006   (JP) .............................. 2006-086009

(51) Int. Cl.
*H01L 21/425* (2006.01)
(52) U.S. Cl. .................. 438/530; 438/423; 438/514; 438/522; 257/E21.561; 257/E21.563
(58) Field of Classification Search ............... 438/415, 438/423, 914
See application file for complete search history.

(56) References Cited

U.S. PATENT DOCUMENTS

| | | |
|---|---|---|
| 2002/0022348 A1 | 2/2002 | Sakaguchi |
| 2003/0008471 A1 | 1/2003 | Norcott |
| 2005/0003229 A1* | 1/2005 | Bedell et al. ............... 428/641 |
| 2005/0139961 A1* | 6/2005 | Brunner et al. ............. 257/616 |
| 2005/0242398 A1* | 11/2005 | Chen et al. .................. 257/348 |
| 2006/0051945 A1* | 3/2006 | Yokokawa et al. .......... 438/526 |
| 2006/0081837 A1* | 4/2006 | Bedell et al. .................. 257/19 |
| 2007/0196995 A1* | 8/2007 | Aoki et al. .................. 438/400 |
| 2007/0224778 A1* | 9/2007 | Murakami et al. .......... 438/459 |
| 2007/0238269 A1* | 10/2007 | Aoki et al. .................. 438/479 |
| 2007/0238312 A1* | 10/2007 | Murakami et al. .......... 438/766 |
| 2008/0128808 A1* | 6/2008 | Yamazaki et al. ........... 257/347 |

FOREIGN PATENT DOCUMENTS

WO    WO 01/84601 A    11/2001

OTHER PUBLICATIONS

Holland et al., "Formation of Ultrathin, Buried Oxides in Si by $O^+$ Ion Implantation", *Applied Physics Letters, AIP, American Institute of Physics*, Melville, NY, US, vol. 69, No. 5, Jul. 29, 1996, pp. 674-676, XP012017096, ISSN: 003-6951.
Ekoue, Adamah, "European Search Report", European Patent Office, May 30, 2007, Application No. EP 07 00 6290, Berlin.

* cited by examiner

*Primary Examiner*—Alexander G Ghyka
*Assistant Examiner*—Cheung Lee
(74) *Attorney, Agent, or Firm*—Sughrue Mion, PLLC; Pavel I. Pogodin

(57) ABSTRACT

A SIMOX wafer is produced by implanting an oxygen ions into a surface of a Si substrate and then conducting a high-temperature annealing, in which an atmosphere in at least an end stage of the high-temperature annealing treatment is an Ar or $N_2$ atmosphere containing an oxygen of more than 3 volume % but not more than 10 volume %.

5 Claims, 1 Drawing Sheet

METHOD OF PRODUCING SIMOX WAFER

BACKGROUND OF THE INVENTION

1. Field of the Invention

This invention relates to a thin film SOI wafer having a buried oxide film (BOX) for forming a high-speed, low power consumption SOI (silicon on insulator) device, and more particularly to a method of producing a SIMOX (separation by implanted oxygen) wafer in which a buried oxide film is formed by implanting oxygen ions into a surface of a wafer and then annealing at a high temperature.

2. Description of Related Art

As a method of producing a thin film SOI wafer, there have hitherto been known a so-called high-dose SIMOX method wherein a dose in the oxygen implantation is high, and a so-called low-dose SIMOX method wherein oxygen ions are implanted at a dose lower by about one significant digit than that of the high-dose SIMOX method and then the annealing is carried out in a high oxygen atmosphere.

As the low-dose SIMOX method is recently developed a so-called MLD (modified low dose) method wherein the formation of BOX at a lower dose is made possible by conducting a final oxygen implantation at a lower dose and about room temperature to form an amorphous layer, which contributes to the mass production of wafers.

The high-dose SIMOX method is a method wherein oxygen ions are implanted under conditions of an acceleration energy: 150 keV, a dose: more than $1.5 \times 10^{18}$ cm$^{-2}$ and a substrate temperature: about 500° C. and thereafter the annealing is carried out at a temperature of higher than 1300° C. in argon (Ar) or nitrogen (N$_2$) atmosphere containing 0.5-2% of oxygen for about 4-8 hours (see K. Izumi et al., Electron lett. (UK) vol. 14, (1978), p.593). However, the high-dose SIMOX method have problems that the implantation time is very long and the throughput is bad and the dislocation density of SOI layer is as very high as $1 \times 10^{5}$-$1 \times 10^{7}$ cm$^{-2}$.

The low-dose SIMOX method improves the above problems of the high-dose SIMOX method, and is typically carried out by implanting oxygen ions under conditions of an acceleration energy: more than 150 keV, a dose: $4 \times 10^{17}$-$1 \times 10^{18}$ cm$^{-2}$ and a substrate temperature: about 400-600° C. and thereafter conducting the annealing at a temperature of higher than 1300° C. in an argon atmosphere containing 30-60% of oxygen, whereby there is attained a significant quality improvement that the buried oxide film (BOX) is thickened by an internal thermal oxidation (which may be abbreviated as "ITOX") at the annealing step and the dislocation density is reduced and the like (see S. Nakashima et al., Proc. IEEE int. SOI Conf. (1994), p71-72).

Further, the MLD method is developed as an improved version of the low-dose SIMOX method, and is a method wherein after the existing oxygen implantation at a high temperature (400-650° C.), a further oxygen implantation of a dose lower by one significant digit is carried out at room temperature to form an amorphous layer on the surface of the buried oxide film (BOX) (see O. W. Holland et al., Appl. Phys. Lett. (USA) vol. 69 (1996), p574 and U.S. Pat. No. 5,930, 643). According to this method, it is possible to conduct the continuous growth of BOX within a wide and low dose range of $1.5 \times 10^{17}$-$6 \times 10^{17}$ cm$^{-2}$, and also even in the subsequent ITOX process, the internal thermal oxidation may be conducted at a rate higher by 1.5 times than that of the conventional ITOX. As a result, the BOX film is very near to the thermal oxide film, and a significant quality improvement is attained. In the MLD method, it is common that the annealing is carried out in an Ar atmosphere containing 0.5-2% of oxygen for about 5-10 hours after the ITOX step in order to decrease an oxygen content in SOI layer.

All of the above SIMOX methods include a high-temperature annealing step, and particularly it is known that the annealing conditions largely affect the quality of the SIMOX wafer. At the end of the annealing step of SIMOX is usually conducted a heat treatment in an Ar atmosphere containing about 0.1-2 volume % of oxygen at a temperature of not lower than 1300° C. for 5 to 10 hours. In this case, it is known that oxygen diffused into the inside of SOI layer at ITO step is diffused outward by such a heat treatment to sufficiently lower the oxygen content in the SOI layer and also the residual defect, oxygen precipitates and the like in the SOI layer disappear, while oxygen precipitates in BOX grow and are united with each other to disappear the defect in the BOX layer and further a good SOI/BOX interface is formed. However, the good characteristic on the surface roughness of the SOI layer is not necessarily obtained stably by the conventional methods.

SUMMARY OF THE INVENTION

Under the above situations, it is an object of the invention to propose a method of advantageously producing a SIMOX wafer wherein the surface roughness is largely improved in the production of a SOI wafer through SIMOX method.

The inventors have made various studies in order to achieve the above object and discovered that the state of crystal structure (step/terrace) of the surface formed in the annealing is largely changed by an oxygen concentration in the annealing and a miscut angle of Si substrate, particularly the oxygen concentration in the annealing and the surface roughness of the SOI layer is changed accompanied therewith, and as a result, the invention has been accomplished.

That is, the summary and construction of the invention are as follows.

(1) A method of producing a SIMOX wafer by implanting oxygen ions into a surface of a Si substrate and then conducting a high-temperature annealing, in which an atmosphere in at least an end stage of the high-temperature annealing treatment is an Ar or N$_2$ atmosphere containing an oxygen of more than 3 volume % but not more than 10 volume %.

(2) A method of producing a SIMOX wafer according to item (1), wherein the high-temperature annealing treatment is a treatment of a temperature: not lower than 1290° C. but lower than 1380° C. and a time: not less than 5 hours but less than 40 hours.

(3) A method of producing a SIMOX wafer according to item (1) or (2), wherein the high-temperature annealing treatment is carried out after an internal oxidation (ITOX) treatment containing an oxygen of 10-70 volume %.

(4) A method of producing a SIMOX wafer according to any one of items (1)-(3), wherein the Si substrate has a miscut angle of not more than 2°.

(5) A method of producing a SIMOX wafer according to any one of items (1)-(4), wherein the production method of the SIMOX wafer is a MLD (modified low dose) method.

According to the invention, there can be obtained SIMOX wafers being excellent in various qualities and very good in the surface roughness of SOI.

DESCRIPTION OF PREFERRED EMBODIMENTS

Figure 1:
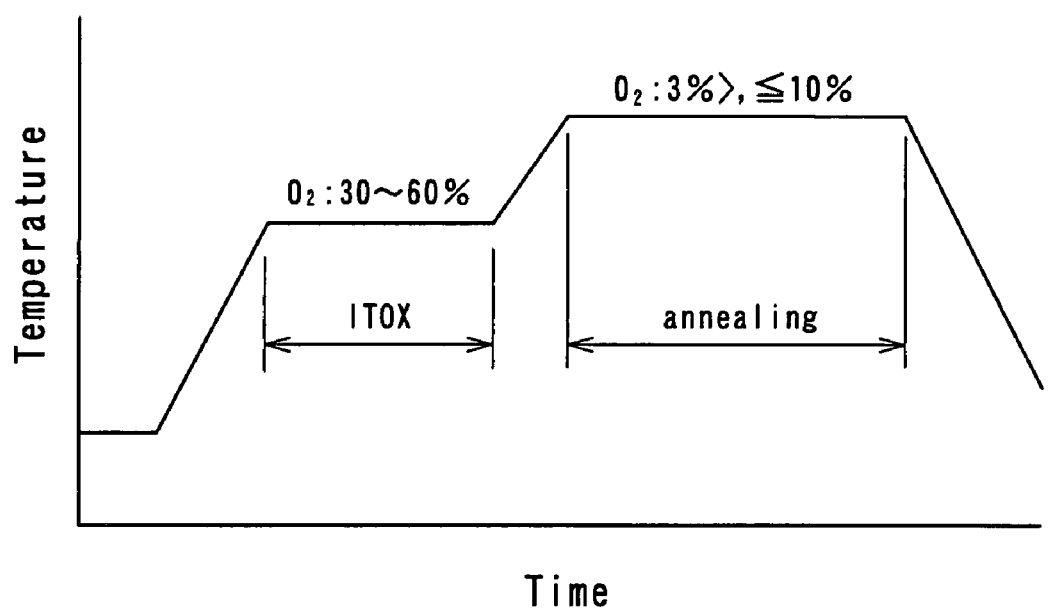
FIG. 1 is a pattern diagram of annealing conditions at an annealing step inclusive of ITOX step.

The details of the invention will be explained below.

At the high-temperature annealing step after the oxygen ion implantation, the oxidation of the silicon surface is promoted to form a thick oxide film. At this time, the increase of solubility in the oxidation course (enhanced solubility) is caused on the silicon surface just beneath the oxide film to bring about an oxygen concentration higher than a saturated oxygen concentration at such a high temperature (see U. Gosele et al., Appl. Phys. Lett. 67, 241 (1995)). On the other hand, an oxygen of a saturated concentration at this temperature is existent on the silicon surface just above BOX oxide film. Therefore, a concentration gradient is caused between up and down of SOI layer to diffuse the oxygen inward (in-diffusion) to thereby produce the growth of BOX.

However, if the oxygen concentration in the annealing atmosphere is too low, the increase of solubility on the surface is not caused and inversely oxygen diffuses outward (out-diffusion). In this connection, it is reported that as a result of the out-diffusion, oxygen is diverged from the neighborhood of the surface oxide film to freely move silicon atom on the surface and cause the re-construction of the surface and hence even if the oxide film is existent on the surface, step/terrace structure appears likewise the bare silicon surface under vaccum or in an inert gas (see D. J. Bottomley et al., Phys. Rev. B, 66, 35301 (2002)).

The inventors have examined an influence of such a phenomenon on the surface roughness of SOI layer in the formation of SIMOX and found out that the step/terrace structure (stepwise surface structure) is produced even in SIMOX wafer and hence the value of the surface roughness as measured by AFM is considerably deteriorated. In the invention is first discovered that the crystal structure of the silicon surface formed in the annealing is largely changed by the oxygen concentration in the annealing to bring about the deterioration of the surface roughness in SOI layer.

Also, it is clearly confirmed that this tendency becomes remarkable as a miscut angle of the silicon substrate in the formation of SIMOX becomes large. The term "miscut angle" used herein means an angle of shifting a cutting face from a plane orientation (100). Although it is already known that the miscut angle of the silicon substrate largely affects the surface roughness of SOI (see U.S. Pat. No. 6,531,411), it is not still known that this tendency becomes remarkable in accordance with the atmosphere in the annealing.

As a result of the inventors' studies, it has been found that when the annealing is carried out in an Ar atmosphere or $N_2$ atmosphere containing more than 3 volume % of oxygen, the out-diffusion of oxygen is not caused and also the re-construction of the surface is not caused. As to the upper limit of the oxygen concentration, it has been found that when the annealing is carried out in an atmosphere having an oxygen concentration of more than 10 volume %, ITOX step is inversely promoted by the in-diffusion of oxygen and the oxygen concentration in SOI layer is too high and the possibility of causing problems such as oxygen precipitation in subsequent device process and the like becomes high. In the invention, therefore, the amount of oxygen to be included in the annealing atmosphere is limited to a range of more than 3 volume % but not more than 10 volume % as a condition of taking good balance therebetween.

Also, it is preferable that the annealing treatment is carried out under conditions that a temperature is not lower than 1290° C. but lower than 1380° C. and a time is not less than 5 hours but less than 40 hours. When the annealing temperature is lower than 1290° C. or when the annealing time is less than 5 hours, the roughnesses of the surface and the interface are deteriorated, while when the annealing temperature is not lower than 1380° C. or when the annealing time is not less than 40 hours, the productivity lowers.

Moreover, it is considered that a ratio of oxygen well balancing the in-diffusion and out-diffusion changes in accordance with the annealing temperature. That is, as the annealing temperature is high, the oxidation step is easily promoted and hence the in-diffusion becomes dominant even in a relatively low oxygen concentration. However, the formation of step/terrace structure on the surface is liable to be easily caused when the temperature is high. Therefore, it is important to adjust the oxygen concentration considering both the effects.

As shown in FIG. 1, the typical annealing step of SIMOX is conduced by a combination of ITOX step at a relatively high oxygen concentration and an annealing step at a relatively low oxygen concentration. The annealing conditions according to the invention are preferable to be applied to such a combination.

Also, the annealing treatment at an adjusted oxygen concentration according to the invention is not necessarily applied to the full step of the annealing, but is sufficient to be applied to at least an end stage of about 1 hour in the above step. Because, the surface state of silicon is mainly determined by the end stage of the annealing step. In this case, the oxygen concentration at a stage before the end stage is preferable to be about 1-3% somewhat lower than that of the end stage.

In the invention, it is preferable that the miscut angle of silicon substrate in the formation of SIMOX is not more than about 0.2°. When the miscut angle of the silicon substrate exceeds 0.2°, the roughnesses of the surface and the interface are considerably deteriorated.

Further, the SIMOX process according to the invention is applicable to any of high-dose method, low-dose method and MLD (modified low dose) method, but is particularly preferable to be applied to the MLD method.

The invention is described with respect to the case of applying to SIMOX process through the MLD method below.

EXAMPLES

At first, oxygen ions are implanted into a Si substrate having a miscut angle of 0.1-0.15° under conditions of an acceleration energy: 170 keV, a dose: $2.5 \times 10^{17}$ $cm^{-2}$ and a substrate temperature: 400° C., and further an ion implantation is carried out at room temperature and a dose of $2 \times 10^{15}$ $cm^{-2}$. Then, ITOX process is conducted at 1320° C. for 10 hours and thereafter an annealing process of 1350° C. and 10 hours is carried out in an Ar atmosphere containing various oxygen concentrations. As to a part of the substrates, the annealing treatment is conducted only at an end stage of 1 hour in the annealing step.

The surface roughness and surface oxygen concentration of the thus obtained SIMOX wafer are measured to obtain results as shown in Table 1.

Moreover, the surface roughness of SOI is measured by using AFM (atomic force microscope) with respect to a size of 10 μm×10 μm and represented by a value of Rms (root means square). Also, the surface oxygen concentration is measured by a secondary ion microprobe spectroscopy (SIMS).

TABLE 1

| No. | Oxygen concentration (volume %) | Annealing temperature (° C.) | Miscut angle (°) | Surface roughness Rms (10 μm × 10 μm) | Surface oxygen concentration ($1 \times 10^{-17}$ cm$^{-3}$) | Remarks |
|---|---|---|---|---|---|---|
| 1 | 0.5 | 1350 | 0.1 | 4.9 | 0.8 | Comparative Example |
| 2 | 1 | 1350 | 0.1 | 4.2 | 0.83 | Comparative Example |
| 3 | 2 | 1350 | 0.1 | 4.1 | 0.84 | Comparative Example |
| 4 | 4 | 1350 | 0.1 | 3.3 | 0.85 | Invention Example |
| 5 | 6 | 1350 | 0.1 | 3.2 | 0.86 | Invention Example |
| 6* | 8 | 1350 | 0.1 | 3.2 | 0.83 | Invention Example |
| 7 | 10 | 1350 | 0.1 | 3.2 | 1.5 | Invention Example |
| 8 | 12 | 1350 | 0.1 | 3.2 | 2.0 | Comparative Example |
| 9 | 0.5 | 1350 | 0.15 | 5.5 | 0.81 | Comparative Example |
| 10 | 1 | 1350 | 0.15 | 4.7 | 0.84 | Comparative Example |
| 11 | 2 | 1350 | 0.15 | 4.5 | 0.84 | Comparative Example |
| 12 | 4 | 1350 | 0.15 | 3.5 | 0.85 | Invention Example |
| 13 | 6 | 1350 | 0.15 | 3.4 | 0.86 | Invention Example |
| 14* | 8 | 1350 | 0.15 | 3.5 | 0.84 | Invention Example |
| 15 | 10 | 1350 | 0.15 | 3.4 | 1.6 | Invention Example |
| 16 | 12 | 1350 | 0.15 | 3.4 | 2.1 | Comparative Example |
| 17 | 0.5 | 1350 | 0.2 | 7 | 0.9 | Comparative Example |
| 18 | 1 | 1350 | 0.2 | 6.3 | 1 | Comparative Example |
| 19 | 2 | 1350 | 0.2 | 4.5 | 1.1 | Comparative Example |
| 20 | 4 | 1350 | 0.2 | 4 | 1.2 | Invention Example |
| 21 | 6 | 1350 | 0.2 | 3.9 | 1.3 | Invention Example |
| 22* | 8 | 1350 | 0.2 | 3.8 | 0.9 | Invention Example |
| 23 | 10 | 1350 | 0.2 | 3.8 | 1.4 | Invention Example |
| 24 | 12 | 1350 | 0.2 | 3.8 | 1.9 | Comparative Example |

*It shows a case that the invention is applied to only an end stage in annealing step.

As seen from Table 1, the surface roughness tends to be deteriorated as the oxygen concentration in Ar atmosphere becomes low. On the other hand, the value of the surface oxygen concentration becomes high as the oxygen concentration in Ar atmosphere increases. From these facts is clear an optimum oxygen concentration range, and preferably the oxygen concentration is more than 4 volume % but not more than 10 volume %.

What is claimed is:

1. A method of producing a SIMOX wafer by implanting oxygen ions into a surface of a Si substrate and then conducting a high-temperature annealing, in which an atmosphere in at least an end stage of the high-temperature annealing treatment is an Ar or $N_2$ atmosphere containing an oxygen of more than 3 volume% but not more than 10 volume%.

2. A method of producing a SIMOX wafer according to claim 1, wherein the high-temperature annealing treatment if a treatment of a temperature: not lower than 1290° C. but lower than 1380° C. and a time: not less than 5 hours but less than 40 hours.

3. A method of producing a SIMOX wafer according to claim 1 or 2, wherein the high-temperature annealing treatment is carried out after an internal oxidation (ITOX) treatment containing an oxygen of 10-70 volume%.

4. A method of producing a SIMOX wafer according to claim 1 or 2, wherein the Si substrate has a miscut angle of not more than 2°.

5. A method of producing a SIMOX wafer according to claim 1 or 2, wherein the production method of the SIMOX wafer is a MLD (modified low dose) method.

* * * * *

UNITED STATES PATENT AND TRADEMARK OFFICE
CERTIFICATE OF CORRECTION

PATENT NO. : 7,550,371 B2
APPLICATION NO. : 11/729292
DATED : June 23, 2009
INVENTOR(S) : Yoshio Murakami, Riyuusuke Kasamatsu and Yoshiro Aoki It is certified that error appears in the above-identified patent and that said Letters Patent is hereby corrected as shown below:

In Table 1 at columns 5 and 6, line 5,

Delete "Surface oxygen concentration $(1 \times 10^{-17} \text{ cm}^{-3})$"

and

Insert --Surface oxygen concentration $(1 \times 10^{17} \text{ cm}^{-3})$--

Signed and Sealed this

Twenty-first Day of December, 2010

David J. Kappos
*Director of the United States Patent and Trademark Office*